(12) United States Patent  
Horton et al.

(10) Patent No.: US 7,999,596 B2
(45) Date of Patent: Aug. 16, 2011

(54) DIGITAL SUPPRESSION OF SPIKES ON AN I²C BUS

(75) Inventors: Stuart M. Horton, Washington, DC (US); Xiaochun Zhao, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 177 days.

(21) Appl. No.: 12/411,720

(22) Filed: Mar. 26, 2009

(65) Prior Publication Data
US 2010/0244919 A1 Sep. 30, 2010

(51) Int. Cl.
H03L 5/00 (2006.01)
H03K 5/08 (2006.01)

(52) U.S. Cl. .......... 327/310; 327/261; 327/552
(58) Field of Classification Search ......... 327/261, 327/310, 552; 710/110
See application file for complete search history.

(56) References Cited

U.S. PATENT DOCUMENTS

| | | | |
|---|---|---|---|
| 5,001,374 A | 3/1991 | Chang | |
| 5,267,172 A * | 11/1993 | Vermesse | 705/410 |
| 5,418,486 A | 5/1995 | Callahan | |
| 6,414,540 B2 * | 7/2002 | Drexler | 327/552 |
| 6,958,641 B2 | 10/2005 | Lee | |
| 7,397,292 B1 | 7/2008 | Potanin | |
| 2007/0024607 A1 * | 2/2007 | Chen | 345/204 |

FOREIGN PATENT DOCUMENTS

EP 1109315 6/2001

* cited by examiner

Primary Examiner — Lincoln Donovan
Assistant Examiner — John W Poos
(74) Attorney, Agent, or Firm — John J. Patti; Wade J. Brady, III; Frederick J. Telecky, Jr.

(57) ABSTRACT

An apparatus that is adapted to receive signals from an Inter-Integrated Circuit (I²C) bus is provided. The apparatus comprises a serial data (SDA) filter, a serial clock (SCL) filter, I²C interface logic, and operational circuitry. The SDA filter is adapted to receive an SDA signal from the I²C bus and includes a hold terminal and a disable terminal. The hold terminal of the SDA filter issues a disable signal when a transient in the SDA signal is detected. The SCL filter is adapted to receive an SCL signal from the I²C bus and includes a hold terminal and a disable terminal. The hold terminal of the SCL filter issues a disable signal when a transient in the SCL signal is detected. Additionally, the hold terminal of the SCL filter is coupled to the disable terminal of the SDA filter, and the hold terminal of the SDA filter is coupled to the disable terminal of the SCL filter. The I²C interface logic is coupled to the SDA filter and to the SCL filter, and operational circuitry is coupled the I²C interface logic.

6 Claims, 3 Drawing Sheets

DIGITAL SUPPRESSION OF SPIKES ON AN I²C BUS

TECHNICAL FIELD

The invention relates generally to Inter-Integrated Circuit (I²C) systems and, more particularly, to deglitch filters for I²C systems.

BACKGROUND

Referring to FIG. 1 of the drawings, the reference numeral 100 generally designates a convention deglitch filter. Filter 100 comprises D flip-flops 102, 104, and 106, and logic 106, where each of the flip-flops 102, 104, and 106 is clocked by clock signal CLK. In operation, data is input through the D terminal of flip-flop 102 and subsequently transferred to flip-flop 104. Logic 106 is coupled to nodes $N_1$ and $N_2$ and looks for spikes or glitches in the data signal or stream. Logic 106 can then provide an input to the D terminal of the flip-flop 108 based on the input from nodes $N_1$ and $N_2$, and the filtered data can be subsequently output at node $N_3$.

Turning to FIG. 2, a timing diagram for an I²C system using the filter of FIG. 1 can be seen. For these I²C systems, filters, such as filter 100, are typically employed for each of the serial data SDA and serial clock SCL. For the I²C system to operate properly there is synchronization for the serial data SDA and serial clock SCL, where the corresponding rising edges of the serial clock SCL follow rising edges of the serial data SDA. As can be seen, short pulse or spike can be seen in the serial data SDA, which propagates through the filter. As a result, a rising edge on the output node $N_3$ of the SDA filter occurs after the corresponding rising edge on output node $N_3$ of the SCL filter, which would indicate a false start condition.

Some other examples of prior art systems are European Patent No. 1109315 and U.S. Pat. Nos. 5,001,374; 5,418,486; 6,958,641; and 7,397,292.

SUMMARY

A preferred embodiment of the present invention, accordingly, provides an apparatus that is adapted to receive signals from an Inter-Integrated Circuit (I²C) bus. The apparatus comprises a serial data (SDA) filter that is adapted to receive an SDA signal from the I²C bus, wherein the SDA filter includes a hold terminal and a disable terminal, and wherein the hold terminal of the SDA filter issues a disable signal when a transient in the SDA signal is detected; a serial clock (SCL) filter that is adapted to receive an SCL signal from the I²C bus, wherein the SCL filter includes a hold terminal and a disable terminal, and wherein the hold terminal of the SCL filter issues a disable signal when a transient in the SCL signal is detected, and wherein the hold terminal of the SCL filter is coupled to the disable terminal of the SDA filter, and wherein the hold terminal of the SDA filter is coupled to the disable terminal of the SCL filter; I²C interface logic that is coupled to the SDA filter and to the SCL filter; and operational circuitry that is coupled the I²C interface logic.

In accordance with a preferred embodiment of the present invention, the SDA filter further comprises a first flip-flop that is adapted to receive the SDA signal; a second flip-flop that is coupled to an output of the first flip-flop; a third flip-flop that is coupled to an output the second flip-flop; and an XOR gate that is coupled to the output of the second flip-flop and to an output of the third flip-flop, wherein the XOR gate issues the disable signal when the transient in the SDA signal is detected.

In accordance with a preferred embodiment of the present invention, the SDA filter further comprises a first multiplexer having a plurality of input terminals, a plurality of select terminals, and an output terminal, wherein at least one of the select terminals of the first multiplexer is coupled to the output of the second flip-flop, and wherein at least one of the select terminals of the first multiplexer is coupled to the output of the third flip-flop; a second multiplexer having a plurality of input terminals, a select terminal, and an output terminal, wherein at least one of the input terminals of the second multiplexer is coupled to the output terminal of the first multiplexer, and wherein the select terminal is coupled to the hold terminal of the SDA filter; and a fourth flip-flop that is adapted to receive a signal from output terminal of the third multiplexer.

In accordance with a preferred embodiment of the present invention, the SCL filter further comprises a first flip-flop that is adapted to receive the SCL signal; a second flip-flop that is coupled to an output of the first flip-flop; a third flip-flop that is coupled to an output the second flip-flop; and an XOR gate that is coupled to the output of the second flip-flop and to an output of the third flip-flop, wherein the XOR gate issues the disable signal when the transient in the SDA signal is detected.

In accordance with a preferred embodiment of the present invention, the SCL filter further comprises a first multiplexer having a plurality of input terminals, a plurality of select terminals, and an output terminal, wherein at least one of the select terminals of the first multiplexer is coupled to the output of the second flip-flop, and wherein at least one of the select terminals of the first multiplexer is coupled to the output of the third flip-flop; a second multiplexer having a plurality of input terminals, a select terminal, and an output terminal, wherein at least one of the input terminals of the second multiplexer is coupled to the output terminal of the first multiplexer, and wherein the select terminal is coupled to the hold terminal of the SDA filter; and a fourth flip-flop that is adapted to receive a signal from output terminal of the third multiplexer.

In accordance with a preferred embodiment of the present invention, a system is provided. The system comprises an I²C bus; an integrated circuit (IC) that is coupled to the I²C bus, wherein the IC includes: a serial data (SDA) filter that is adapted to receive an SDA signal from the I²C bus, wherein the SDA filter includes a hold terminal and a disable terminal, and wherein the hold terminal of the SDA filter issues a disable signal when a transient in the SDA signal is detected; a serial clock (SCL) filter that is adapted to receive an SCL signal from the I²C bus, wherein the SCL filter includes a hold terminal and a disable terminal, and wherein the hold terminal of the SCL filter issues a disable signal when a transient in the SCL signal is detected, and wherein the hold terminal of the SCL filter is coupled to the disable terminal of the SDA filter, and wherein the hold terminal of the SDA filter is coupled to the disable terminal of the SCL filter; I²C interface logic that is coupled to the SDA filter and to the SCL filter; and operational circuitry that is coupled the I²C interface logic.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
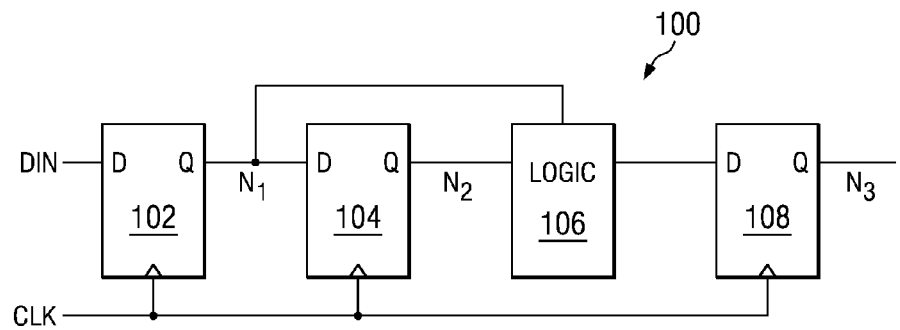
FIG. 1 is a convention deglitch filter.
Figure 2:
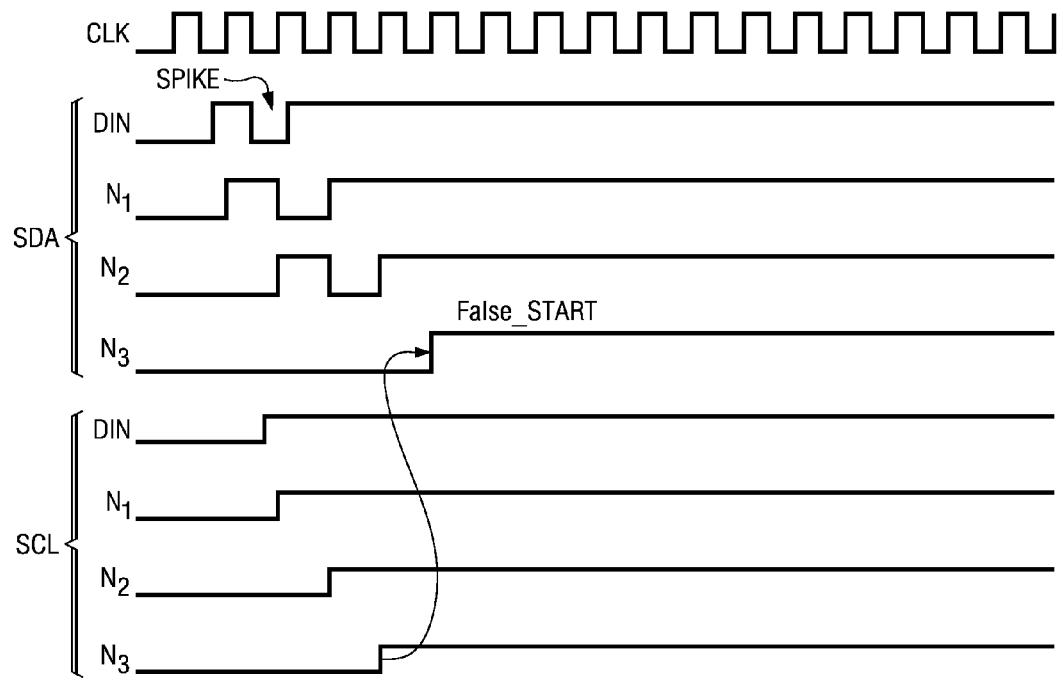
FIG. 2 is a timing diagram for the operation of an I²C system that employs the deglitch filter of FIG. 1.

Refer now to the drawings wherein depicted elements are, for the sake of clarity, not necessarily shown to scale and wherein like or similar elements are designated by the same reference numeral through the several views.

Figure 3:
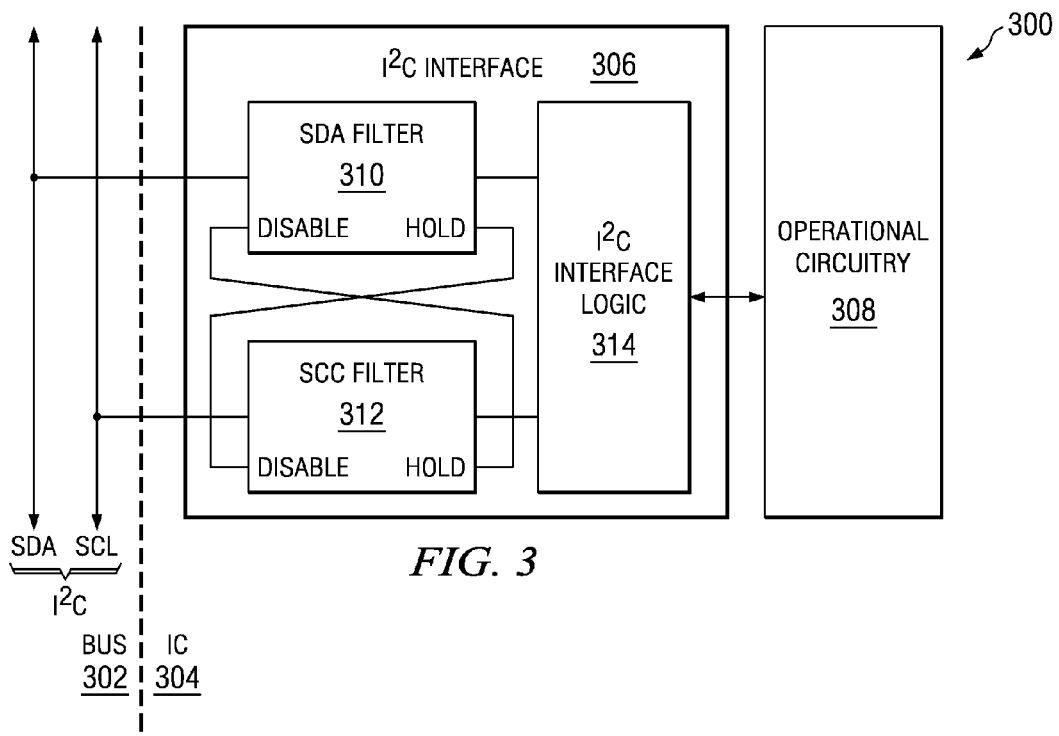
FIG. 3 is a block diagram of a I²C system employing a deglitch filtering scheme in accordance with a preferred embodiment of the present invention.

Referring to FIG. 3 of the drawings, the reference numeral 300 generally designates an I²C system employing a deglitch filtering scheme in accordance with a preferred embodiment of the present invention. System 300 generally comprises an I²C bus 302 and an integrated circuit or IC 304. The I²C bus 302 includes a serial data SDA bus and a serial clock SCL bus so as to communicate with multiple I²C devices. IC 304 generally comprises an I²C interface 306 that allows for communication across the I²C bus 302 and with operational circuitry 308 (that performs a desired function).

In operation, the I²C interface 306 employs SDA filter 310 and SCL filter 312 and I²C interface logic 314 to provide generally deglitched communications over the I²C bus 203. The SDA filter 310 and SCL filter 312 are each coupled between the I²C bus 302 and I²C interface logic 314, which, in turn, is coupled to operational circuitry 308. To perform the deglitching, though, each of filters 310 and 312 include cross-coupled disable and hold terminals. Thus, when a glitch is detected in either of filters 310 or 312, a disable signal $\overline{EN}$ can be issued from the hold terminal to the disable terminal of the other filter 310 or 312. Thus, serial data SDA and serial clock SCL can be synchronized and avoid the potential false starts that are prevalent in conventional deglitch filters.

Figure 4:
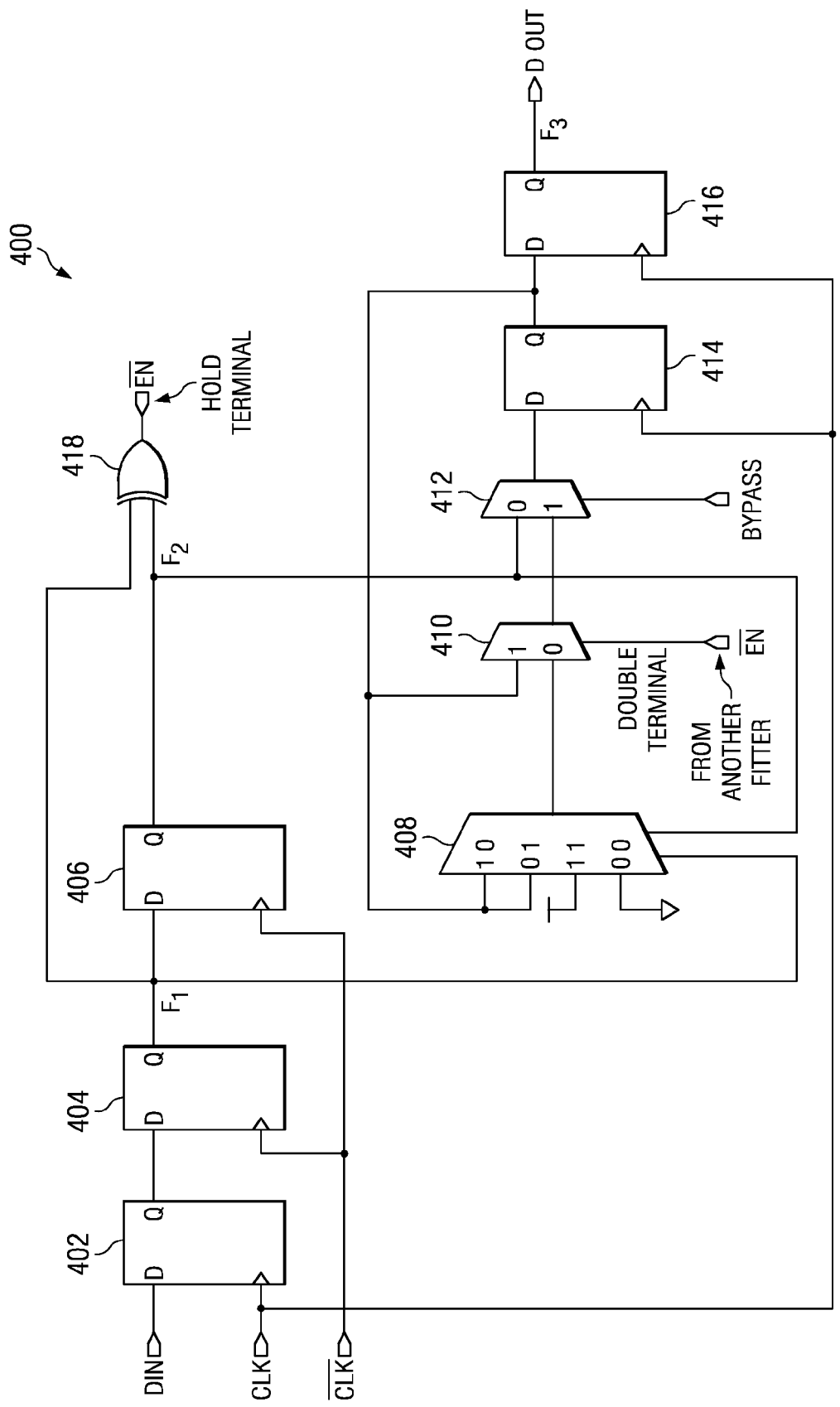
FIG. 4 is a circuit diagram that depicts at least a portion of the deglitch filters of FIG. 3 in greater detail.

To accomplish this, filters 310 and 312 generally take the form of filter 400 as shown in FIG. 4. Filter 400 is generally comprised of D flip-flops 402, 404, 406, 414, and 416, multiplexers or muxes 408, 410, and 412, and XOR gate 418. Flip-flop 402 receives a data input DIN at its D terminal and is clocked by the clock signal CLK. The output Q of flip-flop 402 is coupled to the D terminal of flip-flop 404 (which is clocked by the clock bar signal $\overline{CLK}$). The output Q of flip-flop 404 is coupled (at node $F_1$) to the D terminal of flip-flop 406 (which is clocked by the clock bar signal $\overline{CLK}$), to a select terminal of mux 408, and to an input terminal of XOR gate 418. The output Q of flip-flop 406 is coupled (at node $F_2$) to an input terminal of the XOR gate 418 and to a select terminal of mux 408. Mux 408 has an output that is coupled to mux 410 (which receives a disable signal $\overline{EN}$ as a select signal), and mux 408 is coupled to mux 412 (which receives a bypass signal BYPASS as a select signal). An output of mux 412 is coupled to the D terminal of flip-flop 414 (which is clocked by the clock signal CLK), and the output Q of flip-flop 414 is coupled to the D terminal of flip-flop 416 (which is clocked by the clock signal CLK). Flip-flop 416 can then output the filtered data output DOUT to node $F_3$.

In operation, this filter 400 is able to generate a filter data output DOUT and a disable signal $\overline{EN}$. Generally, when the data input DIN is input into flop-flop 402, it propagates through flip-flops 404 and 406. The XOR gate 418 will then output a disable signal $\overline{EN}$ based on the logic values at nodes $F_1$ and $F_2$ at the hold terminal of filter 400. Also, based on the values at nodes $F_1$ and $F_2$, mux 408 operates similar to a decoder in that, for different logic values at nodes $F_1$ and $F_2$, the mux 408 outputs a particular signal. Preferably, the output of mux 408 operates as follows: a logic high or "1" is output if both nodes $F_1$ and $F_2$ have a logic high or "1" value; a logic low or "0" is output if both nodes $F_1$ and $F_2$ have a logic low or "0" value; and mux 408 operates as a "pass-trough" device for signals from the output of flip-flop 414 if the values at nodes $F_1$ and $F_2$ are different. Mux 410 receives the signal from mux 408 and operates as a "pass-trough" device either for signals from the output of flip-flop 414 if the disable signal $\overline{EN}$ from another filter at the disable terminal of filter 400 is logic high or for mux 408 if the disable signal $\overline{EN}$ from another filter at the disable terminal of filter 400 is logic low. Mux 412 operates to disable this deglitch operation if the bypass signal BYPASS is logic low. A signal from mux 412 can then be propagated through flip-flops 414 and 416 to output node $F_3$.

Figure 5:
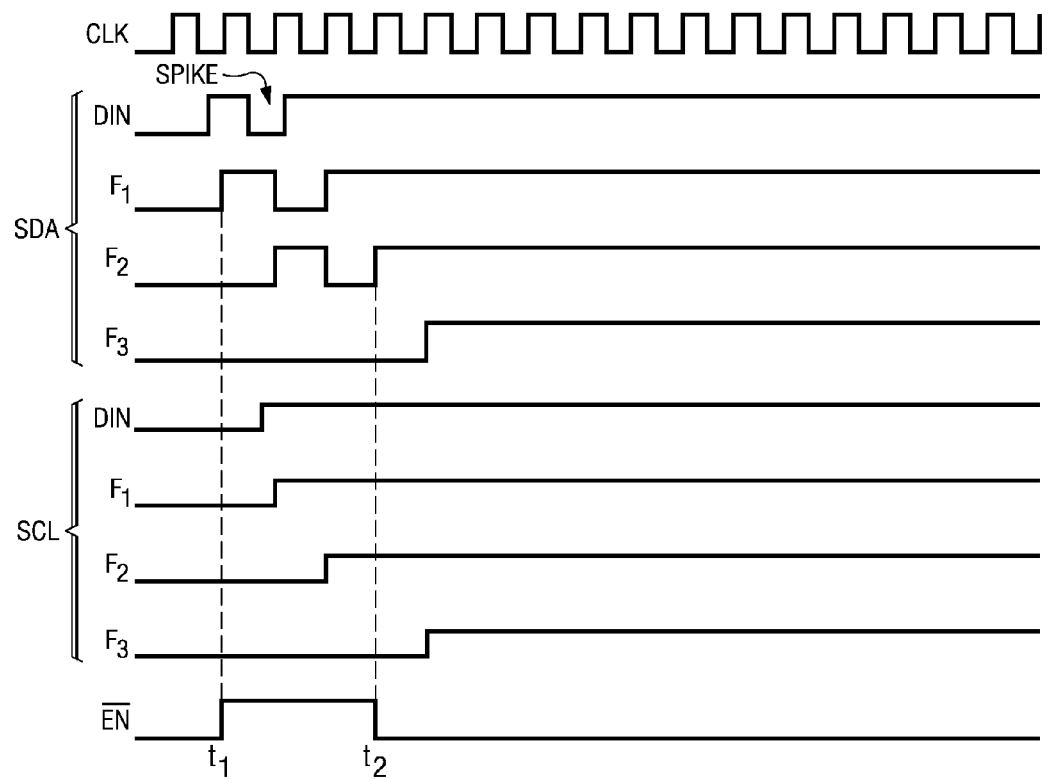
FIG. 5 is timing operation of a I²C system of FIG. 3.

Turning to FIG. 5, a timing diagram of the I²C system 300, where the filters 310 and 312 generally take the form of filter 400. Initially, a short pulse or spike is seen being input to the filter 310. This spike propagates through flip-flops 402, 404, and 406 of filter 310. Since this spike is short, the XOR gate 418 of filter 310 outputs a logic high disable signal $\overline{EN}$ between during the period from $t_1$ to $t_2$. During this period where the disable signal $\overline{EN}$ is logic high, a logic low is output at node $F_3$ of filter 312. It is after node $F_3$ of filter 310 transitions to logic high that node $F_3$ of filter 312 transitions to logic high, effectively eliminating a false start error.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus that is adapted to receive signals from an Inter-Integrated Circuit (I²C) bus, the apparatus comprising:
   a serial data (SDA) filter that is adapted to receive an SDA signal from the I²C bus, wherein the SDA filter includes a hold terminal and a disable terminal, and wherein the hold terminal of the SDA filter issues a disable signal when a transient in the SDA signal is detected, wherein the SDA filter includes:
   a first flip-flop that is adapted to receive the SDA signal;
   a second flip-flop that is coupled to an output of the first flip-flop;
   a third flip-flop that is coupled to an output the second flip-flop;
   an XOR gate that is coupled to the output of the second flip-flop and to an output of the third flip-flop, wherein the XOR gate issues the disable signal when the transient in the SDA signal is detected a first multiplexer having a plurality of input terminals, a plurality of select terminals, and an output terminal, wherein at least one of the select terminals of the first multiplexer is coupled to the output of the second flip-flop, and wherein at least one of the select terminals of the first multiplexer is coupled to the output of the third flip-flop;

a second multiplexer having a plurality of input terminals, a select terminal, and an output terminal, wherein at least one of the input terminals of the second multiplexer is coupled to the output terminal of the first multiplexer, and wherein the select terminal of the second multiplexer is coupled to the hold terminal of the SDA filter; and a fourth flip-flop that is adapted to receive a signal from output terminal of the second multiplexer;

a serial clock (SCL) filter that is adapted to receive an SCL signal from the I²C bus, wherein the SCL filter includes a hold terminal and a disable terminal, and wherein the hold terminal of the SCL filter issues a disable signal when a transient in the SCL signal is detected, and wherein the hold terminal of the SCL filter is coupled to the disable terminal of the SDA filter, and wherein the hold terminal of the SDA filter is coupled to the disable terminal of the SCL filter;

I²C interface logic that is coupled to the SDA filter and to the SCL filter; and operational circuitry that is coupled the I²C interface logic.

2. The apparatus of claim 1, wherein the SCL filter further comprises:

a fifth flip-flop that is adapted to receive the SCL signal;

a sixth flip-flop that is coupled to an output of the fourth flip-flop;

a seventh flip-flop that is coupled to an output the sixth flip-flop; and an XOR gate that is coupled to the output of the sixth flip-flop and to an output of the seventh flip-flop, wherein the XOR gate issues the disable signal when the transient in the SDA signal is detected.

3. The apparatus of claim 2, wherein the SCL filter further comprises:

a third multiplexer having a plurality of input terminals, a plurality of select terminals, and an output terminal, wherein at least one of the select terminals of the third multiplexer is coupled to the output of the sixth flip-flop, and wherein at least one of the select terminals of the third multiplexer is coupled to the output of the seventh flip-flop;

a fourth multiplexer having a plurality of input terminals, a select terminal, and an output terminal, wherein at least one of the input terminals of the fourth multiplexer is coupled to the output terminal of the third multiplexer, and wherein the select terminal of the fourth multiplexer is coupled to the hold terminal of the SDA filter; and an eighth flip-flop that is adapted to receive a signal from output terminal of the fourth multiplexer.

4. An system comprising:

an I²C bus;

an integrated circuit (IC) that is coupled to the I²C bus, wherein the IC includes:

a serial data (SDA) filter that is adapted to receive an SDA signal from the I²C bus, wherein the SDA filter includes a hold terminal and a disable terminal, and wherein the hold terminal of the SDA filter issues a disable signal when a transient in the SDA signal is detected, wherein the SDA filter includes:

a first flip-flop that is adapted to receive the SDA signal;

a second flip-flop that is coupled to an output of the first flip-flop;

a third flip-flop that is coupled to an output the second flip-flop;

an XOR gate that is coupled to the output of the second flip-flop and to an output of the third flip-flop, wherein the XOR gate issues the disable signal when the transient in the SDA signal is detected a first multiplexer having a plurality of input terminals, a plurality of select terminals, and an output terminal, wherein at least one of the select terminals of the first multiplexer is coupled to the output of the second flip-flop, and wherein at least one of the select terminals of the first multiplexer is coupled to the output of the third flip-flop;

a second multiplexer having a plurality of input terminals, a select terminal, and an output terminal, wherein at least one of the input terminals of the second multiplexer is coupled to the output terminal of the first multiplexer, and wherein the select terminal of the second multiplexer is coupled to the hold terminal of the SDA filter; and a fourth flip-flop that is adapted to receive a signal from output terminal of the second multiplexer;

a serial clock (SCL) filter that is adapted to receive an SCL signal from the I²C bus, wherein the SCL filter includes a hold terminal and a disable terminal, and wherein the hold terminal of the SCL filter issues a disable signal when a transient in the SCL signal is detected, and wherein the hold terminal of the SCL filter is coupled to the disable terminal of the SDA filter, and wherein the hold terminal of the SDA filter is coupled to the disable terminal of the SCL filter;

I²C interface logic that is coupled to the SDA filter and to the SCL filter; and operational circuitry that is coupled the I²C interface logic.

5. The system of claim 4, wherein the SCL filter further comprises:

a fifth flip-flop that is adapted to receive the SCL signal;

a sixth flip-flop that is coupled to an output of the fourth flip-flop;

a seventh flip-flop that is coupled to an output the sixth flip-flop; and an XOR gate that is coupled to the output of the sixth flip-flop and to an output of the seventh flip-flop, wherein the XOR gate issues the disable signal when the transient in the SDA signal is detected.

6. The system of claim 5, wherein the SCL filter further comprises:

a third multiplexer having a plurality of input terminals, a plurality of select terminals, and an output terminal, wherein at least one of the select terminals of the third multiplexer is coupled to the output of the sixth flip-flop, and wherein at least one of the select terminals of the third multiplexer is coupled to the output of the seventh flip-flop;

a fourth multiplexer having a plurality of input terminals, a select terminal, and an output terminal, wherein at least one of the input terminals of the fourth multiplexer is coupled to the output terminal of the third multiplexer, and wherein the select terminal of the fourth multiplexer is coupled to the hold terminal of the SDA filter; and an eighth flip-flop that is adapted to receive a signal from output terminal of the fourth multiplexer.

* * * * *